United States Patent [19]
van Der Put

[11] 4,332,342
[45] Jun. 1, 1982

[54] METHOD OF SOLDERING COMPONENTS TO A THICK-FILM SUBSTRATE

[75] Inventor: Henricus C. A. van Der Put, Eindhoven, Netherlands

[73] Assignee: U.S. Philips Corporation, New York, N.Y.

[21] Appl. No.: 246,525

[22] Filed: Mar. 23, 1981

Related U.S. Application Data

[63] Continuation of Ser. No. 39,716, May 17, 1979, abandoned.

[30] Foreign Application Priority Data

May 29, 1978 [NL] Netherlands ........................ 7805800

[51] Int. Cl.³ .............................................. B23K 1/02
[52] U.S. Cl. ................................ 228/180 A; 228/200; 228/242
[58] Field of Search .................. 228/122, 123, 180 A, 228/200, 231, 232, 242

[56] References Cited

U.S. PATENT DOCUMENTS

| | | | |
|---|---|---|---|
| 2,495,150 | 1/1950 | Van Deventer | 228/232 |
| 3,500,536 | 3/1970 | Goldschmied | 228/231 |
| 3,825,994 | 7/1974 | Coleman | 228/240 |

FOREIGN PATENT DOCUMENTS 2014177 10/1971 Fed. Rep. of Germany ...... 228/200

*Primary Examiner*—Gil Weidenfeld
*Assistant Examiner*—K. J. Ramsey
*Attorney, Agent, or Firm*—Norman H. Spain

[57] ABSTRACT

A method of and a device for soldering components on thick-film substrates according to the reflow method. Successively, the substrates are preheated, followed by heating to the soldering temperature, after which they are cooled. A wave of molten metal of a given temperature is used for preheating, heating and cooling of the substrates.

4 Claims, 1 Drawing Figure

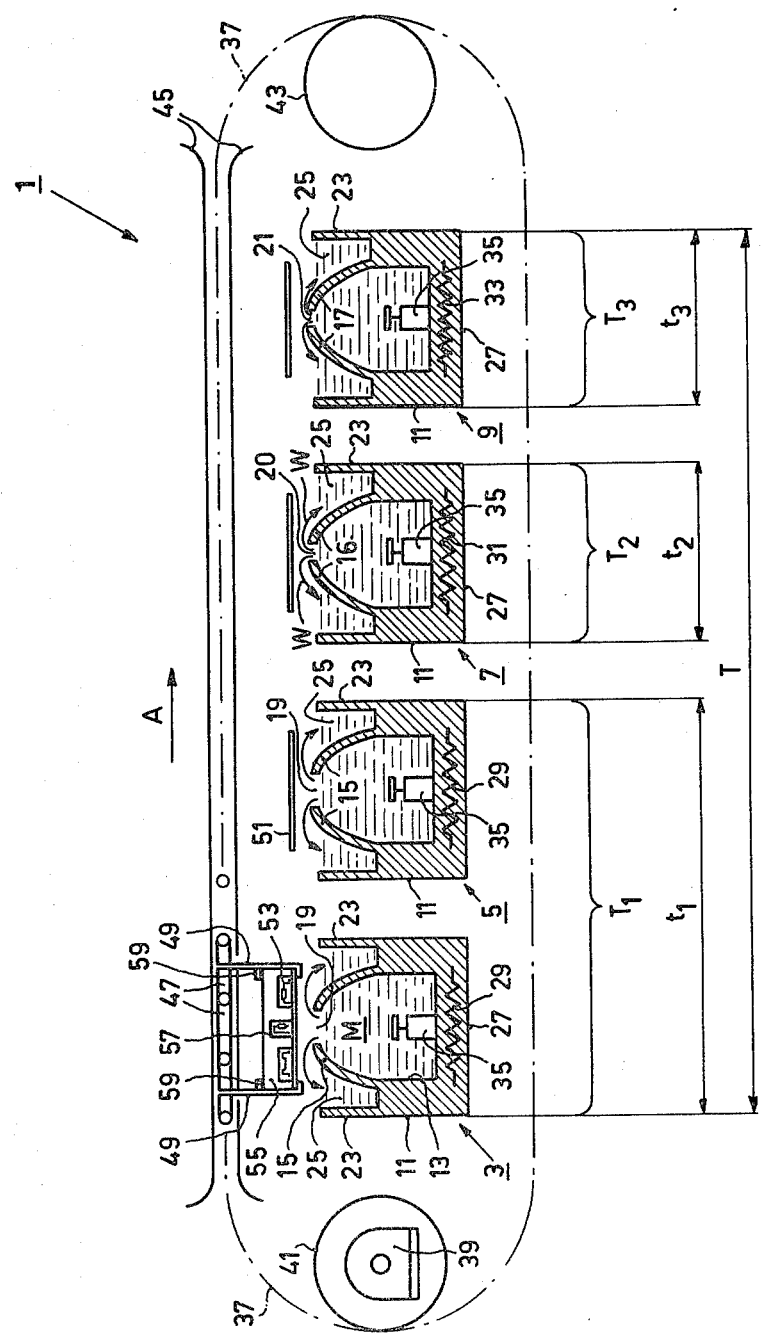

METHOD OF SOLDERING COMPONENTS TO A THICK-FILM SUBSTRATE

This is a continuation, of application Ser. No. 039,716, filed May 17, 1979 and now abandoned.

The invention relates to a method of soldering components to a thick-film substrate which is locally provided with a layer of solder paste. The substrate with the components resting on the solder paste, is preheated to a temperature below the melting point of the solder during a preheating phase, after which it is heated during a soldering phase to a temperature sufficiently high to cause the solder to start to melt and flow, after which, soldering phase, it is cooled during a cooling phase to a temperature below the melting point of the solder.

For the soldering of components to thick-film substrates, usually made of a ceramic material, for example, aluminum oxide, it is known to apply the heat required for the melting of the solder by means of hot air, by radiation, for example infrared radiation, or by contact with a metal heating block. The application of heat by means of hot air or by radiation requires comparatively long heating times, with the risk of excessive heat being applied to the components. The application of heat by means of a heating block causes, in view of the unavoidable unevennesses of the substrate and the warping of the heating block occurring during use, a non-uniform heat flow through the substrate, which results in the substrate being overheated, which is liable to cause overheating of the components.

The drawbacks of these conventional heating methods are eliminated in a method which is known from United States Patent Specification 3,825,994. In this method the substrate is made to float on a wave of liquid metal for a predetermined period of time and without wetting the face of the substrate supporting the components; the substrate can be preheated by means of infrared radiators and is allowed to cool in the ambient atmosphere after departure from the metal wave; there is a risk that the components will be overheated during the comparatively slow cooling process by the heat accumulated in the substrate.

The object of the invention is to provide a method which enables components to be soldered to a thick-film substrate in a reliable and reproducible manner without the risk of damaging the components or the substrate and without wetting the face of the substrate supporting the components, the process time being substantially shorter than that used in the known methods.

This object is achieved in accordance with the new and novel method of the invention by contacting the substrate bearing the layer of solder paste and the components with the heated matter metal which serves as a heat transfer medium during all three phases and cooling the substrate at an accelerated rate during the cooling phase.

Because use is made of molten metal at a suitable temperature for the heat transfer medium in each of the three phases, a comparatively high and uniform heat transfer is also obtained during the preheating and the cooling in a comparatively short process time. The application of heat to the substrate as well as the dissipation of heat from the substrate can be dosed and controlled.

Due to the comparatively short process time, and especially due to the accelerated cooling, the risk of the components being damaged by overheating is virtually avoided.

According to one method in accordance with the invention, the substrate is successively guided along a number of waves of molten metal and is pressed against these waves.

Because the molten metal is kept in molten and because the substrate is pressed against the wave of molten metal, intimate contact between the molten metal and the substrate is obtained, thus favouring heat transfer from the molten metal to the substrate or vice versa.

According to another embodiment of the method of the invention, the substrate is preheated in two steps during the preheating phase. The solvent in the solder paste is thus prevented from evaporating too quickly, thus avoiding possible spattering of a silk-screened solder paste. Moreover, it has been found that the solder paste, thanks to the gradual preheating, melts completely, flows and mixes very well, so that no soldering pellets remain in the flux, thus improving the reliability and the strength of the ultimate soldered connections.

A more specific embodiment in accordance with the invention, wherein a substrate of aluminum oxide is coated with a solder paste consisting of a lead tin alloy having a melting point of 183° C., is characterized in that during the preheating phase as well as during the soldering phase and the cooling phase use is made of a molten metal in the form of a lead-tin-bismuth alloy with a melting range of from 95° to 110° C., the temperatures of the three phases being 180°±5° C., 250°±3° C. and 110°±5° C., respectively, the substrate being brought into contact with the alloy for 8 seconds during the preheating phase, for 2 seconds during the soldering phase, and for 2 seconds during the cooling phase. Tests have demonstrated that optimum results are obtained by means of this method. Soldering pastes of different compositions flowed and mixed equally well. Due to the comparatively long preheating phase, a comparatively short soldering phase suffices. During the cooling phase the substrate is effectively cooled to below 150° C. within two seconds, so that the critical temperature of the components, at which the components are thermally damaged, is not exceeded.

Assemblies comprising thick-film substrates bearing components soldered by means of the method in accordance with the invention have uniform and strong soldered connections with a minimum tensile strength of at least 10 N in a direction perpendicular to the substrates.

The invention also relates to an apparatus for performing the method according to the invention, this apparatus comprising a preheating unit, a soldering unit and a cooling unit, and transport means for continuously transporting substrates bearing a solder paste coating and components to be soldered along the said units, the soldering unit comprising a wave generator for generating a wave of hot molten metal; in accordance with the invention, this device is characterized in that the preheating unit and the cooling unit each comprise a wave generator.

The above described apparatus enables a series of substrates supporting components to be soldered to be successively transported along the successive wave generators at a constant speed and in a continuous motion; the overall cycle time required for performing the soldering process is of the order of 15 seconds at a transport speed of approximately 3 cm/s.

The preheating unit of a preferred embodiment of an apparatus in accordance with the invention comprises two wave generators. As a result of this simple step, a comparatively long preheating phase can be realised without varying the transport speed and without standstill.

Suitable contact between the heat transfer medium and the substrates to be treated is ensured by another embodiment of the apparatus in accordance with the invention. In this embodiment, the transport means comprise guide members for retaining the substrates in a vertical direction transversely to the transport direction. The substrates are pressed against the metal wave by means of the guide members. Lifting of the substrates in a vertical direction by the metal wave and floating of the substrates on the metal waves, which might cause less intimate contact between the metal waves and the substrates and hence poor heat transfer, are thus prevented.

An embodiment of the invention will now be described with reference to the single FIGURE of the accompanying diagrammatic drawing of a preferred embodiment of an apparatus in accordance with the invention.

An apparatus 1 comprises four wave generators 3, 5, 7 and 9 which are arranged in line. Each of the wave generators is of a construction known per se and consists of a container 11 with a chamber 13 containing hot molten metal M.

Part of each chamber 13 is closed by a pair of inwardly sloping guide walls 15, 16 and 17 which bound an outlet opening 19, 20 and 21, respectively. Between the guide walls 15, 16 and 17 and upright sidewalls 23 of the containers, there are provided collecting chambers 25 which communicate with the chamber 13 via return ducts (not shown). In the thick-walled bottom 27 of the containers there are provided variable electrical resistance elements 29, 31, 33 for heating the metal M to the desired temperature. Each container accommodates a pump 35 for producing a wave of molten metal which is forced by the pump through the respective outlet opening 19, 20 and 21, and flows over the guide walls 15, 16 and 17 in the form of a double wave W, and drops into the collecting chambers 25, wherefrom it returns to the chamber 13 via the return duct (not shown). Excessive oxidation of the hot metal is prevented in known manner by dosed addition of a cover oil on the metal M.

The apparatus furthermore comprises transport means which consist of an endless transport chain 37 which is guided in a closed loop along the outlet openings of the wave generators at a distance in the direction of the arrow A in the embodiment shown. The transport chain is driven by a variable electric motor 39, via a sprocket 41. Guide wheels are arranged along the path of the transport chain 37, one of which guide wheels is denoted by the reference numeral 43. The transport chain in the vicinity of the wave generators is guided by rails 45. Brackets 49 which serve as carriers for the substrates 51 to be treated are connected to the links 47 of the transport chain at regular intervals. The substrates 51 are fed together with components 53 to be soldered, which components are maintained in position in a manner known per se by means of jigs 55 provided with recesses 57 adapted to the shape of the components.

For performing the method according to the invention the jigs 55 together with the substrates 51 and the components 53 are secured to the brackets 49 by means of guide and clamping members 59 and are transported by the transport chain 37 along the successive wave generators 3, 5, 7 and 9 in such a way that the substrates 51 with their free bottom face are brought into contact with and forced against the waves W of molten metal; lifting and displacement of the substrates in a vertical direction by the metal waves is prevented by the guide and clamping members 59.

The wave generators 3 and 5 are identical and together form a preheating unit T1; the wave generator 7 acts as a soldering unit T2 for heating the substrates 51 to the soldering temperature, whilst the wave generator 9 serves as the cooling unit T3. For optimum performance of the process, the individual units should contain metal alloys having a suitable melting range and which are maintained at different temperatures. The desired temperature of the metal in the containers 11 can be obtained by selection of a resistance element having a suitable power and/or by control of the relevant resistance element.

Preferably, a metal alloy is chosen which is suitable for use in all units. However, alloys can be used for the soldering unit which have a higher melting range than the alloys used for the preheating unit and the cooling unit.

A further important parameter is formed by the contact time during the individual phases. Since the substrated to be treated move at a constant speed, the contact time of the substrates with the metal waves of the different phases depends on the number of wave generators per unit and/or of the effective wavelength per wave generator.

In the embodiment shown, the preheating unit T1 comprises two wave generators, with the result that the contact time is doubled in comparison with the soldering unit T2 and the cooling unit T3.

As appears furthermore from the drawing, the outlet openings 19 of the wave generators 3 and 5 are wider than the outlet openings 20 and 21 of the wave generators 7 and 9, with the result that the effective wavelength of these generators and the contact time during the preheating phase is further increased. In order to minimize the overall cycle time, the wave generators are arranged as near to each other as possible.

Using the method and the apparatus according to the invention, components were soldered to substrates of aluminium oxide, having a thickness of 0.7 mm. The maximum permissible critical temperature of the components at which overheating causes thermal damage to the components varied between 85° C. and 114° C. The substrates were provided with palladium silver conductor tracks and locally with a 160 $\mu$m thick layer of solder paste comprising a lead-tin alloy with a melting point of 183° C.

The soldering process was performed using the following conditions:

transport speed V: 3 cm/s,
Preheating unit T1:
    number of wave generators: 2;
    effective wavelength per wave generator: 12 cm;
    metal alloy: lead-tin-bismuth;
    melting range: 95° to 110° C.;
    temperature: 180°±5° C.;
    total contact time: 8 s.
Soldering unit T2:
    number of wave generators: 1;
    effective wavelength: 6 cm;

metal alloy: lead-tin-bismuth;
melting range: 95° to 110° C.;
temperature: 250°±3° C.;
contact time: 2 s.

Cooling Unit T3:
number of wave generators: 1;
effective wavelength: 6 cm;
metal alloy: lead-tin-bismuth;
melting range: 95° to 110° C.;
temperature: 110°±5° C.;
contact time: 2 s.

The overall cycle time T amounted to 14 s. The results obtained were very satisfactory. The soldered joints were regular, free from pores and had a neat appearance; the tensile strength of the soldered joints amply satisfied the requirements imposed. No damage of the components and/or the substrate was found to occur; the reproducibility was found to be excellent.

The method and the apparatus can be rather simply adapted for various substrates and/or components by control of the temperatures, by a suitable choice of the alloys, by determination of the effective wavelength, by control of the transport speed, etc.

What is claimed is:

1. In the method of soldering components to a thick film substrate comprising:
    (1) heating an assembly of said substrate with said components locally provided with a layer of solder between said components and said substrate in a preheating phase to a temperature below the melting point of said solder;
    (2) heating said assembly to a temperature sufficiently high to cause the solder to melt and flow during a soldering phase and
    (3) subjecting said assembly to a temperature during a cooling phase to a temperature below the melting point of said solder;
    the improvement wherein through each of said phases the substrate bearing the layer of solder and the components positioned therein is contacted with a heated molten metal heat transfer medium and during the cooling phase the substrate is cooled at a rate sufficiently effective to cool said substrate below 150° C. within 2 seconds.

2. The method of claim 1 characterized in that the substrate is successively guided along and pressed against a number of waves of the heated molten metal.

3. The method of claim 1 or 2 characterized in that, during the preheating phase, the substrate is preheated in two steps.

4. The method of claim 3 wherein the substrate consists of aluminum oxide and the solder paste consists of a lead tin alloy having a melting point of 183° C., characterized in that in the preheating phase, the soldering phase and the cooling phase the molten metal heat transfer medium is in the form of a molten lead-tin-bismuth alloy of a melting point from 95° to 100° C., the temperature of the heating phase is 180°±5° C., the temperature of the soldering phase is 250°±3° C. and the temperature of the cooling phase is 110°±5° C., respectively, the substrate is in contact with the molten lead-tin-bismuth alloy for 8 seconds during the preheating phase, for 2 seconds during the soldering phase, and for 2 seconds during the cooling phase.

* * * * *